(12) United States Patent
Aubert

(10) Patent No.: US 9,234,949 B2
(45) Date of Patent: Jan. 12, 2016

(54) SUPERCONDUCTING MAGNET DEVICE

(75) Inventor: Guy Aubert, Poitiers (FR)

(73) Assignee: Commissariat A L'Energie Atomique Et Aux Energies Alternatives, Paris (FR)

( * ) Notice: Subject to any disclaimer, the term of this patent is extended or adjusted under 35 U.S.C. 154(b) by 563 days.

(21) Appl. No.: 13/810,488

(22) PCT Filed: Jul. 8, 2011

(86) PCT No.: PCT/FR2011/051634
§ 371 (c)(1),
(2), (4) Date: Mar. 27, 2013

(87) PCT Pub. No.: WO2012/007680
PCT Pub. Date: Jan. 19, 2012

(65) Prior Publication Data
US 2013/0207658 A1 Aug. 15, 2013

(30) Foreign Application Priority Data

Jul. 16, 2010 (FR) ...................................... 10 55818

(51) Int. Cl.
| | | |
|---|---|---|
| G01V 3/00 | (2006.01) | |
| G01R 33/3815 | (2006.01) | |
| G01R 33/38 | (2006.01) | |
| G01R 33/3873 | (2006.01) | |
| H01F 6/06 | (2006.01) | |
| H01F 41/02 | (2006.01) | |

(52) U.S. Cl.
CPC ........ *G01R 33/3815* (2013.01); *G01R 33/3802* (2013.01); *G01R 33/3873* (2013.01); *H01F 6/06* (2013.01); *H01F 41/02* (2013.01); *Y10T 29/4902* (2015.01)

(58) Field of Classification Search
CPC .................................................... G01R 33/3815
USPC ........................... 324/320, 319, 318; 335/216
See application file for complete search history.

(56) References Cited

U.S. PATENT DOCUMENTS

| 4,584,548 A | 4/1986 | Inoue et al. | |
|---|---|---|---|
| 6,084,497 A | 7/2000 | Crozier et al. | |
| 7,898,258 B2* | 3/2011 | Neuberth et al. | ............. 324/320 |
| 8,305,173 B2* | 11/2012 | Tamura | ......................... 335/216 |
| 2009/0261246 A1 | 10/2009 | Neuberth et al. | |
| 2013/0265124 A1* | 10/2013 | Aubert | ......................... 335/216 |
| 2014/0128267 A1* | 5/2014 | Wang et al. | ................... 505/162 |

* cited by examiner

*Primary Examiner* — Louis Arana
(74) *Attorney, Agent, or Firm* — The Webb Law Firm

(57) ABSTRACT

Disclosed is a compact superconducting magnet device for generating an intense and homogeneous magnetic field component Bz along an axis Oz in a zone of interest ZI successively includes, starting from the axis Oz, at least two coaxial superconducting helical coils formed around circular cylinder sections of axis Oz delimited by end circles. The lateral ends of the helical coils are arranged, to within the thickness of the coils, in the vicinity of one same sphere of radius c whose center O is placed on the axis Oz at the center of the zone of interest ZI and which encompasses the magnetic device assembly. The azimuthal current densities $j_1, j_2$ of the helical coils are of opposite sign. The lengths of the helical coils are of decreasing length.

13 Claims, 1 Drawing Sheet

SUPERCONDUCTING MAGNET DEVICE

FIELD OF THE INVENTION

The subject of the present invention is a superconducting magnet device capable of producing an intense, homogeneous magnetic field Bz along an axis Oz in a zone of interest ZI which may be of large volume e.g. for applications in nuclear magnetic resonance (NMR) or magnetic resonance imaging (MRI).

The invention also concerns a method for producing said superconducting magnet device.

PRIOR ART

The manufacture of magnets producing a highly homogeneous magnetic field within a sizeable volume, in particular for NMR or MRI, entails the use of specific magnetic configurations which may prove to be very difficult to carry out. Hence the idea of seeking a magnet structure that is simple and easy to use with accuracy, such as a winding of helical layers sufficiently long so that the transitions from one layer to the next and the inevitable junctions between successive lengths of conductors are positioned sufficiently distant from the volume of interest so as not to disturb the computable theoretical homogeneity of the helical coil.

A helical coil is not axisymmetric but the pitch of the helix is generally sufficiently small so that resulting differences compared with a theoretical axisymmetric coil are negligible. In addition, it is possible to choose the number of turns per layer and the number of layers so that near-perfect compensation of these differences is obtained. The remainder hereof shall therefore be limited to purely axisymmetric configurations of axis Oz also having symmetry relative to their median plane xOy. The expansion in spherical harmonics (ESH) of the component $B_z$ of the field in the inner zone of interest (<<bore>> of the magnet) then assumes the following very simple form:

$$B_z = Z_0 + \sum_{p=1}^{\infty} Z_{2p} r^{2p} P_{2p}(\cos\partial)$$

This ESH is valid inside the largest sphere of centre O and not containing any current or magnetized material.

It is easily shown that the relative coefficients $$\frac{Z_n}{Z_0}$$

of this ESH are decreasing functions of the minimum radius $a_1$ of the coil as $$\frac{1}{a_1^n}.$$

Therefore, to obtain a given theoretical homogeneity in a sphere centred on the origin of radius $a < a_1$, all $Z_{2p}$ terms must be cancelled for $1 \leq p \leq p_0$. It is evidently sought to do so in the most economical way possible.

For obvious reasons (installation, use, external perturbations . . . ) it is sought to limit the external field generated by the magnet (<<stray field>>). The theoretical method is similar to the one used for homogeneity but a so-called external ESH is used that is valid outside the smallest sphere of centre O and not containing any current or magnetized material:

$$B_z = \sum_{p=1}^{\infty} M_{2q} \frac{1}{r^{2q+1}} P_{2q}(\cos\partial)$$

The coefficients of this ESH are called <<moments>> of current distribution and the first thereof, $M_2$, is the dipolar moment.

The first step to be taken to reduce the external field is to cancel the dipolar moment, which involves the use of currents rotating around Oz in opposite direction to those which produce the field in the volume of interest, which therefore contributes towards a reduction thereof.

A superconducting magnet configuration has already been proposed in document US 2009/0261246 A1, comprising a main superconducting coil of length $L_1$ having symmetry of rotation about an axis z to set up a main magnetic field in an inner space, and an external auxiliary superconducting coil coaxial to the main superconducting coil, of length $L_2$ shorter than length $L_1$, and having symmetry of rotation about the axis z so as to set up, within the inner space, a field of opposite direction to that of field set up by the main superconducting coil. The superconducting magnet configuration also comprises rings in ferromagnetic material which are arranged in the inner volume defined by the main superconducting coil to allow compensations and to increase the homogeneity of the magnetic field in the volume of interest.

With said device it is therefore possible to improve the homogeneity of the magnetic field in the volume of interest, at the cost of an increase in weight due to the rings in ferromagnetic material, and above all at the cost of restriction of the free space within the volume of interest since the rings in ferromagnetic material are arranged inside the free space defined by the main superconducting coil. If it is desired to maintain the same free space for the volume of interest, the overall dimensions of the whole device must be increased by increasing the diameter of the superconducting coils, which is detrimental to compactness and increases manufacturing costs.

DEFINITION AND SUBJECT OF THE INVENTION

The present invention sets out to overcome the above-mentioned shortcomings and to allow a superconducting magnet device to be produced that is more compact than existing devices whilst being easy to produce and allows an intense, very homogeneous magnetic field to be obtained in a volume of interest, which can be used in particular for NMR or MRI applications.

By intense magnetic field is meant a magnetic field of at least 0.5 T, preferably of 1 T or higher, and which in some embodiments can exceed 10 T.

The invention also sets out to define a method for producing such device which is simplified but nonetheless allows optimized homogenization to be obtained of the magnetic field set up in the volume of interest.

These objectives are reached according to the invention by means of a compact superconducting magnet device for generating a homogeneous magnetic field component Bz along an axis Oz in a zone of interest ZI for nuclear magnetic resonance or magnetic resonance imaging applications successively comprising, starting from the axis Oz and in a direction perpendicular to this axis Oz, at least one first helical superconducting coil formed around a first circular cylinder section of axis Oz delimited by first end circles, the said first helical superconducting coil having a first outer radius, a first inner radius and a first length, with a first azimuthal current density $j_1$, at least one second helical superconducting coil formed around a second circular cylinder section of axis Oz delimited by second end circles, and surrounding said first circular cylinder section, said second coil having a second outer radius, a second inner radius and a second length with a second azimuthal current density $j_2$, characterized in that the lateral ends of the first and second helical coils are arranged, to within the thickness of the coils, in the vicinity of one same sphere of radius c whose centre O is positioned on the axis Oz in the centre of said zone of interest ZI and which encompasses the whole magnet device, in that said first and second azimuthal current densities $j_2$ are of opposite sign, and in that rings in magnetic material centred on the axis Oz and having symmetry relative to a median plane xOy passing through the centre O of the sphere and perpendicular to the axis Oz are inserted between the first and second coils inside the said sphere and are magnetized to saturation with magnetization in opposite direction to that of the field set up in the centre O of said sphere.

According to one particular embodiment, the compact superconducting magnet device further comprises at least one third helical superconducting coil formed around a third circular cylinder section of axis Oz delimited by third end circles and surrounding said second circular cylinder section, said third helical superconducting coil having a third outer radius, a third inner radius and a third length with a third azimuthal current density $j_3$. The first, second and third azimuthal current densities $j_1, j_2, j_3$ are of alternate opposite signs, and the first, second and third lengths of the first, second and third helical superconducting coils are of decreasing length.

According to one particular characteristic, the rings in magnetic material centred on the axis Oz comprise two pairs of rings of different sections arranged symmetrically relative to the said median plane xOy.

The superconducting magnet device of the invention can be used irrespective of the desired field value. It can in particular be used to obtain a homogeneous magnetic field component Bz that is intense e.g. of 10 or 11 Teslas.

According to one particular embodiment, the rings in magnetic material are in magnetic material having saturation magnetization at least as high as that of iron e.g. iron and iron alloys and in particular an alloy of iron and cobalt.

According to another possible embodiment, the rings in magnetic material are in ferrite of composition $XFe_2O_4$, where X is formed of one or more of the elements comprising Mn, Zn, Ni, Co, Cu, Mg, Fe.

The invention also concerns a method for producing a superconducting magnet device to generate a homogeneous magnetic field component Bz along an axis Oz in a zone of interest ZI for nuclear magnetic resonance or magnetic resonance imaging applications, characterized in that it comprises the following steps:

a) determining a first circular cylinder section of axis Oz delimited by first end circles and having a first predefined radius and a first predefined length respectively corresponding to the minimum radius and maximum length of said zone of interest ZI, b) determining a last circular cylinder section of axis Oz delimited by last end circles, surrounding said first circular cylinder section and having a last predefined radius and a last predefined length so that the said last circular cylinder section is contained within a sphere of radius c and of centre O containing said zone of interest ZI, c) considering a first surface current sheet formed on the first circular cylinder section of axis Oz, and a last thin surface current sheet formed on the last circular cylinder section of axis Oz, the successive coaxial surface current sheets each having a surface azimuthal current density $\kappa_i$ such that two adjacent coaxial surface current sheets have surface azimuthal current densities of opposite sign, and determining the geometry of intermediate rings in magnetic material centred on the axis Oz and having symmetry relative to a median plane xOy passing through the centre O of the sphere and perpendicular to the axis Oz and inserted between the first and second coils inside the said sphere, the said rings being magnetized with magnetization in opposite direction to that of the field set up at the centre O of the said sphere so as to optimize the homogeneity of the magnetic field in the said zone of interest ZI, and d) replacing the successive coaxial surface current sheets by axisymmetric superconducting helical coils with rectangular axial half-section of nonzero thickness such that the lateral ends of the helical coils are arranged, to within the thickness of the coils, in the vicinity of one same sphere of radius c whose centre O is placed on the axis Oz in the centre of said zone of interest ZI and which encompasses the whole magnet device.

According to one particular embodiment of the method conforming to the invention, the determination is also made of an intermediate circular cylinder section of axis Oz delimited by intermediate end circles, inserted between said first circular cylinder section and said last circular cylinder section, the said intermediate circular cylinder section having an intermediate predefined radius of between the minimum radius of said zone of interest ZI and the last predefined radius, and an intermediate predefined length of between said last predefined length and said maximum length, such that the first end circles, the intermediate end circles and the last end circles are positioned substantially on said sphere of centre O and radius c, an intermediate surface current sheet is determined and an intermediate axisymmetric superconducting helical coil is determined with rectangular axial half-section of nonzero thickness, the rings in magnetic material being arranged in the free space lying between the first superconducting helical coil corresponding to the first circular cylinder section and the intermediate axisymmetric superconducting helical coil corresponding to the intermediate circular cylinder section.

BRIEF DESCRIPTION OF THE DRAWINGS

Other characteristics and advantages of the invention will become apparent from the following description of particular embodiments of the invention given as examples and with reference to the appended drawings in which.

DETAILED DESCRIPTION OF PREFERRED EMBODIMENTS

Figure 1:
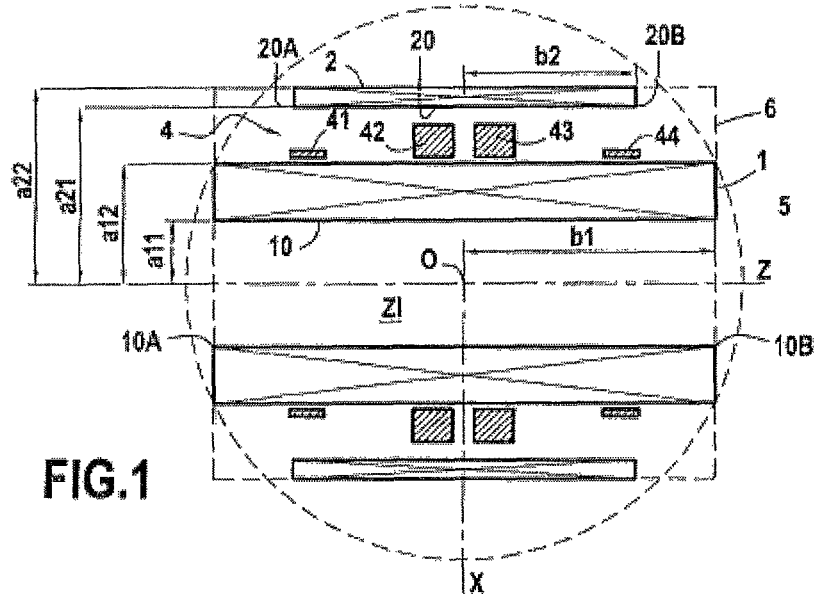
FIG. 1 is a schematic view of a magnetic device with solenoids having a rectangular axial half-section of significant thickness and intermediate rings in magnetic material according to a first embodiment of the invention.

According to the invention, the method for optimizing magnet structures formed of axisymmetric coils with rectangular axial half-section comprises a first step which entails not taking into account the thickness of the coils. It has effectively been found that taking into account the thickness of the coils ab initio leads to cumbersome calculations and does not allow easy apprehending of the essential characteristics of the structure.

According to the invention, consideration is therefore given, at a first step, to configurations having surface current sheets carried by circular cylinders of axis Oz. In the remainder of the description, said current sheet will be called a <<thin solenoid>> without further details.

Each thin solenoid is characterized by its radius a, dimensions $b_1$ and $b_2$ of its first and second ends allowing the defining of a length 2b or half-length b, and by the surface density of the azimuthal current density κ it carries, measured algebraically around Oz. The following denotations are used:

$$c = \sqrt{a^2 + b^2}$$
$$\sin\alpha = \frac{a}{c}$$
$$\cos\alpha = \frac{b}{c}$$

The coefficients of inner and outer expansion in spherical harmonics expansion (ESH) are obtained using the following expressions:

$$Z_0 = \frac{\mu_0 \kappa}{2}[\cos\alpha]_{b_1}^{b_2}$$

$$Z_{n\geq 1} = -\frac{\mu_0 \kappa}{2n}\left[\frac{1}{c^n}\sin\alpha P_n^1(\cos\alpha)\right]_{b_1}^{b_2}$$

$$M_{n\geq 2} = \frac{\mu_0 \kappa}{2(n+1)}[c^{n+1}\sin\alpha P_n^1(\cos\alpha)]_{b_1}^{b_2}$$

It is recalled that $M_0=0$ since Maxwell's equations were written so as to cause the magnetic charges to disappear only leaving the electric charges to subsist (no magnetic <<monopoly>>). Also, the expression of $M_n$ above leads to $M_1=0$ and the first nonzero moment is theoretically the dipolar moment, the general property of any current distribution.

These expressions reveal a remarkable property. If an assembly of such coaxial solenoids is considered, whose end circles are positioned on one same sphere of radius c, each solenoid is then only characterized by two parameters $\alpha_i$ and $\kappa_i$. This configuration can be termed <circumspherical>. To produce a homogeneous magnet, these parameters are chosen for simultaneous cancellation of the $Z_{2n}$ terms (the terms of uneven degree are zero on account of symmetry relative to xOy) up to degree $2n_0$, the moments $M_{2n}$ will also all be cancelled up to the same degree. By improving homogeneity, the external field here is therefore concomitantly reduced.

With the use of two solenoids it is possible to cancel $Z_2$ and hence simultaneously $M_2$. According to the invention, a configuration with two or three solenoids is used which allows an improvement in homogeneity whilst contributing towards perfecting field homogeneity by adding iron rings, or more generally rings in magnetic material, in a free space contained between the innermost main superconducting helical coil delimiting the volume of the zone of interest and the superconducting helical coil coaxial to the main superconducting helical coil immediately surrounding the latter, whilst leaving entirely free the zone of interest ZI lying inside the innermost main superconducting helical coil.

Figure 2:
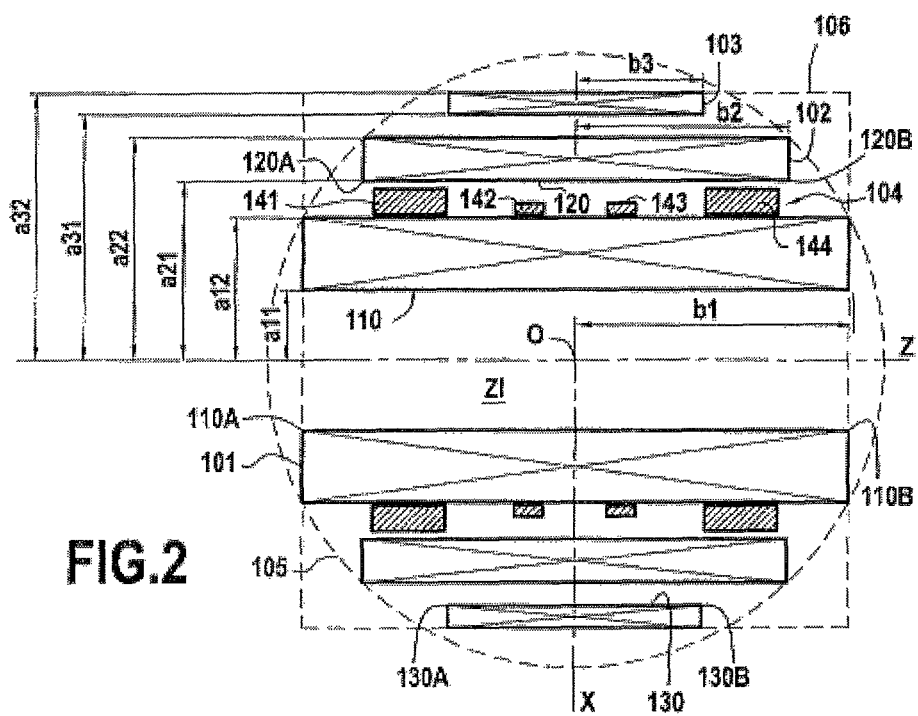
FIG. 2 is a schematic view of a magnet device with three solenoids having a rectangular axial half-section of significant thickness and intermediate rings in magnetic material according to a second embodiment of the invention.

FIG. 1 illustrates a circumspherical magnet according to the invention in its configuration with two solenoids 1, 2 arranged coaxially about the axis Oz from inside to outside, whilst FIG. 2 illustrates a circumspherical magnet of the invention in its configuration with three solenoids 101, 102, 103 arranged coaxially about the axis Oz from inside to outside, rings in magnetic material having saturation magnetization 4 (FIG. 1) or 104 (FIG. 2) being inserted between the first solenoid 1 respectively 101 and the second solenoid 2 respectively 102, but the zone of interest ZI defined by the cylindrical segment 10 respectively 110 on which the first solenoid 1 respectively 101 is formed remaining fully free and exempt of any such rings in magnetic material.

The rings 4, 104 in magnetic material allow an improvement in the homogeneity of the magnet. These rings allow a homogeneous magnet to be produced with only two coils 1, 2 but in prior art embodiments they have the disadvantage of taking up part of the free space in the volume of interest and hence of leading to an increase in the inner radius of the coil if it is desired to maintain the same free access.

In the configurations of the invention, consideration is given to the fact that, in a configuration with at least two coaxial superconducting coils 1, 2 respectively 101, 102 having azimuthal current densities in opposite directions, there is a free space between the inner coil 1, respectively 101, and the following coaxial coil 2, respectively 102, which forms a region in which the field is of opposite direction to the field at the centre O, is most substantially uniform and still sufficiently intense to obtain extensive saturation magnetization of a ring or of a series of rings in magnetic material 4, 104 placed thereat. Since the magnetization is then of opposite direction to the field at the centre O, it contributes towards reinforcement thereof and hence to a reduction in the volume of superconductor needed to obtain the same field as without a ring 4, 104.

This property is indeed verified in the Examples given in FIGS. 1 and 2 in which four rings with saturation magnetization 41 to 44 (FIG. 1) respectively 141 to 144 (FIG. 2) are inserted in this region.

In the case shown in FIG. 2, with the example detailed below, it is possible to improve the homogeneity of a similar device without an iron ring, by reducing by 7.3% the volume of superconductor required for the coils 101 to 103, which becomes 18.693 m$^3$, whilst the volume of iron required (which is less costly than the superconducting material) is 1.578 m$^3$ and the space of the zone of interest ZI remains entirely free.

It is possible strictly to cancel an additional term, i.e. $Z_6$, and the only remaining term is $Z_8$=−0.072 ppm @ $r_0$=0.2 m. The homogeneity is therefore fully noteworthy with the 1 ppm line at z=0.2805 m on the axis and ρ=0.3233 m in the median plane.

On the outside, the 5 gauss line lies more distant on the axis i.e. 9.7 m but closer in the median plane i.e. 5.418 m.

A substantial improvement in homogeneity is therefore obtained by reducing by 1.465 m$^3$ the volume of coil winding in costly superconducting material replacing it by a substantially equal volume of less costly iron, and especially by maintaining the free space in the volume of interest and not increasing the overall dimensions of the entire device.

FIG. 1 more specifically concerns the homogenization of a magnet with two simple coils 1, 2. As in the configuration with three coils such as the one in FIG. 2, it is possible to find a solution with two coils whose homogeneity is obtained by means of rings 4 placed in the intermediate region where they are magnetized to saturation with magnetization of opposite direction to the field at the centre O. This provides a solution with a reduced number of coils (two) which do not encumber the free inner diameter contrary to other prior art embodiments.

As an example, the parameters are given below of a magnet with which it is possible to produce a magnetic field of 11 Teslas whilst being less cumbersome than prior art embodiments that have already been proposed to obtain such magnetic field intensity, and which additionally improves homogeneity.

The inner and outer radii of the superconducting coils are here denoted $a_1$ and $a_2$ respectively whilst the half-length of the superconducting coils is denoted b and the end dimensions of the iron rings 42, 43 or 41, 44 are respectively denoted $b_1$ and $b_2$:

| Superconducting coils | | | |
|---|---|---|---|
| $a_1$ (m) | $a_2$ (m) | b (m) | j (A / mm²) |
| 0.5 | 0.930625 | 1.9 | 31.6 |
| 1.363319 | 1.5 | 1.281941 | −37.92 |

| Iron rings ($\mu_0 M = -2.2$ T) | | | |
|---|---|---|---|
| $a_1$ (m) | $a_2$ (m) | $b_1$ (m) | $b_2$ (m) |
| 0.975 | 1.220573 | 0.075942 | 0.374249 |
| 0.975 | 1.017437 | 1.055777 | 1.315642 |

$B_0$=11.7436 T
$V_S$=10.507 m³
$V_F$=1.149 m³
$Z_2=Z_4=Z_6=0$
$M_2=0$

In this example, the following are initially fixed: inner radius $a_1$ of the coil 1 (i.e. 0.5 m), the half-length b of this coil 1 (i.e. 1.9 m), the outer radius $a_2$ of the coil 2 (i.e. 1.5 m), the inner radius $a_1$ of each series of rings 41, 44 and 42, 43 (i.e. 0.975 m), and the azimuthal current densities j of the coils 1 and 2 (i.e. respectively 31.6 A/mm² and −37.92 A/mm²), and via computing the other measurements required for defining the magnet device are determined (i.e. the outer radius $a_2$ of the coil 1, the inner radius $a_1$ of the coil 2, the half-length b of the coil 2, the outer radii $a_2$ of the iron rings 41, 44 and 42, 43 and the end dimensions $b_1$ and $b_2$ of the iron rings 42, 43 or 41, 44).

The coil volume is 9.948 m³ and the quantity of iron is about 9.04 tonnes. Although the inner ESH coefficients are only strictly cancelled up to sixth-order inclusive, homogeneity is excellent since the following coefficients are very small. Therefore, for $r_0$=0.2 m, the only coefficients higher than ppb are:

$Z_8$=−0.097 ppm
$Z_{10}$=0.006 ppm

The 1 ppm line is positioned at z=0.2714 m on the axis and at p=0.3092 m in the median plane.

Since only the dipolar moment can be cancelled, the 5 gauss line is at 10.58 m on the axis and at 10.36 m in the median plane, i.e. a substantially better result than for other embodiments which do not implement the invention (12.25 m and 9.885 m respectively).

The homogenization material can be adapted to the field value. The preceding examples relate to magnets which generate sufficiently strong magnetic fields so that it is possible to use insertion elements in magnetic material having saturation magnetization at least as high as that of iron, e.g. iron or an iron alloy and in particular an alloy of iron and cobalt.

If it is desired to produce a weaker field i.e. $B'_0$=$kB_0$, k<1, it is sufficient, without changing the computed dimensions for iron, to choose a soft material whose saturation magnetization is $\mu_0 M = \kappa \mu_0 M_{Fe} \approx \kappa \times 2.2$ T. Such materials can be obtained without difficulty from the family of ferrites of composition $XFe_2O_4$ where X can be one of the elements Mn, Zn, Ni, Co, Cu, Mg, Fe . . . or a mixture of these elements in suitable proportions.

It can be noted that with X=Fe, the magnetite $Fe_3O_4$ is obtained but advantageous use can be made of soft ferrites containing the first three cited elements, i.e. Mn, Zn, Ni.

In FIGS. 1 and 2, it can be seen that it is possible for example to use two pairs of rings of different cross-sections 41, 44 and 42, 43 (FIG. 1) or 141, 144 and 142, 143 (FIG. 2) arranged symmetrically relative to the median plane xOy perpendicular to the axis Oz. In FIG. 1, the central pair of rings 42, 43 has a larger cross-section than the pair of outer rings 41, 44, the lengths of the different rings being similar. In FIG. 2, it is the pair of outer rings 141, 144 which has a larger section than the central pair of rings 142, 143, the lengths of the central rings 142, 143 being shorter than those of the outer rings 141, 144. The number and relative size of the different rings may be different from the examples given in the drawings.

In FIG. 1, the two solenoids 1, 2 each defined by a cylinder section 10, 20 respectively limited by end circles 10A, 10B, 20A, 20B essentially inscribed in the vicinity of a smaller sphere 5 of radius c, have azimuthal current densities of opposite signs. Therefore for solenoid 1, the azimuthal current density j is positive for example whilst the intermediate solenoid 2 has a negative azimuthal current density j.

Similarly, in FIG. 2, the three solenoids 101, 102, 103 each defined by a cylinder section 110, 120, 130 respectively limited by end circles 110A, 110B, 120A, 120B, 130A, 130B essentially inscribed in the vicinity of a smaller sphere 105 of radius c, have azimuthal current densities of opposite sign. For example the solenoids 101 and 103 have a positive azimuthal current density j whilst the intermediate solenoid 102 has a negative azimuthal current density j.

As already indicated above, according to the invention, consideration is first given, at a first step, to configurations with surface current sheets carried by circular cylinders of axis Oz, said current sheets being called <<thin solenoids>>, to determine the parameters relating to a magnet device of the invention, then consideration is given to the actual thicknesses of the coils to finalize the determination of the characteristics of the magnet device. It is effectively easier to determine the main characteristics of the magnet device, which are capable of producing a homogenous field, by considering thin solenoids without involving the true thicknesses of the coils, and then at a second step to adjust the parameters to take these actual thicknesses into account.

The invention therefore particularly concerns a method for producing a superconducting magnet device to generate a homogeneous magnetic field component Bz along an axis Oz in a zone of interest ZI, which comprises the following steps:

a) determining a first circular cylinder section 10 (FIG. 1) or 110 (FIG. 2) of axis Oz delimited by first end circles 10A, 10B respectively 110A, 110B and having a first predefined radius $a_1$ and a first predefined length $2b_1$ respectively corresponding to the minimum radius and maximum length of the zone of interest ZI, b) determining a last circular cylinder section 20 respectively 130 of axis Oz delimited by last end circles 20A, 20B respectively 130A, 130B, surrounding the first circular cylinder section 10 respectively 110 and having a last predefined radius $a_2$; $a_3$ and a last predefined length $2b_2$; $2b_3$ such that the said last circular cylinder section 20 respectively 130 is contained in a sphere of radius c and centre O containing the said zone of interest ZI, c) considering a first surface current sheet formed on the first circular cylinder section 10 respectively 110 of axis Oz, and a last thin surface current sheet formed on the last circular cylinder section 20 respectively 130 of axis Oz, the successive coaxial surface current sheets each having a surface azimuthal current density $\kappa_i$ such that two adjacent coaxial surface current sheets have surface azimuthal current densities of opposite sign, and determining the geometry of intermediate rings 4 respectively 104 in magnetic material centred on the axis Oz and having symmetry relative to a median plane xOy passing through the centre O of the sphere 5 respectively 105 perpendicular to the axis Oz and inserted between the first and second coils 1, 2 respectively 101, 102 inside the said sphere 5 respectively 105, the said rings 4 respectively 104 being magnetized with magnetization of opposite direction to that of the field set up at the centre O of the said sphere 5 respectively 105 so as to optimize the homogeneity of the magnetic field in said zone of interest ZI, and d) replacing the successive coaxial surface current sheets by axisymmetric superconducting helical coils with rectangular axial half-section of nonzero thickness 1, 2 respectively 101, 102, 103 such that the lateral ends of the helical coils 1, 2 respectively 101, 102, 103 are arranged in the vicinity of one same sphere 5 respectively 105 of radius c whose centre O is placed on the axis Oz in the centre of said zone of interest ZI and which encompasses the magnetic device assembly.

For the final actual configurations of the superconducting helical coils with rectangular axial half-section of nonzero thickness, the following denotations are used in FIGS. 1 and 2:

Inner radius of the first coils 1, 101: $a_{11}$
Outer radius of the first coils 1, 101: $a_{12}$
Inner radius of the second coils 2, 102: $a_{21}$
Outer radius of the second coils 2, 102: $a_{22}$
Inner radius of the third coils 103: $a_{31}$
Outer radius of the third coils 103: $a_{32}$
Length of the first coils 1, 101: $2b_1$
Length of the second coils 2, 102: $2b_2$
Length of the third coils 103: $2b_3$ For the configurations with thin solenoids, a single radius is considered which is then denoted as follows:

Radius of the first thin solenoids: $a_1$
Radius of the second thin solenoids: $a_2$
Radius of the third thin solenoid: $a_3$ The circumspherical configuration with three solenoids in FIG. 2 depends on 5 parameters if the subscripts 1, 2 and 3 respectively are allocated to each of the thin solenoids:

$$\alpha_1, \alpha_2, \alpha_3$$
$$\frac{\kappa_2}{\kappa_1}, \frac{\kappa_3}{\kappa_1}$$

It is possible to meet two (and no more!) conditions of homogeneity:

$$Z_2 = Z_4 = 0$$

which will lead to cancellation of the dipolar moment and of the quadripolar moment.

$\alpha_1$ is fixed a priori by the effective inner radius $a_1$ of the thin solenoid which corresponds to a circular cylinder section 110 of axis Oz limited by end circles 110A, 110B and delimiting a zone of interest ZI which is to be left free and subjected to a magnetic field that is the most homogeneous possible, $\alpha_3$ is fixed a priori by the outer radius<c not to be exceeded for the outermost thin solenoid.

There therefore remains a degree of freedom and hence possible optimization. The governing magnitude thereof is the factor of quality whose general expression for a circumspherical configuration of thin solenoids is the following:

$$Q = \frac{\sin^2\alpha_1 \left|\sum_i \kappa_i \cos\alpha_i\right|}{\sum_i |\kappa_i| \sin\alpha_i \cos\alpha_i}$$

It is sufficient to maximize Q paying heed to the abovementioned constraints for full determination of the configuration.

If, as an example, the following values are imposed for the first and third solenoids:

$$\begin{aligned} a_1 &= 1 \text{ m} \\ b_1 &= 3.7 \text{ m} \end{aligned} \to \alpha_1 = 0.263964$$

$$\alpha_3 = \frac{\pi}{2} - \alpha_1 \to \begin{aligned} a_3 &= 3.7 \text{ m} \\ b_3 &= 1 \text{ m} \end{aligned}$$

It is ascertained that a <<square assembly>> 106 is defined whose length $2b_1$ is equal to the outer diameter $2a_3$ of the third solenoid.

The optimal solution is then deduced for the second intermediate solenoid, and in this example it comes to be following:

$$\alpha_2 = 0.790145 \to \begin{aligned} a_2 &= 2.723001 \text{ m} \\ b_2 &= 2.697270 \text{ m} \end{aligned}$$

$$\frac{\kappa_2}{\kappa_1} = -0.259402$$

$$\frac{\kappa_3}{\kappa_1} = 0.108687$$

$$B_0 = 0.811169 \, \mu_0 \kappa_1$$

$$Q = 0.135029$$

According to the invention, after determining the desired configuration with two or three thin solenoids as indicated in the foregoing, the successive coaxial surface current sheets are replaced by axisymmetric superconducting helical coils with rectangular axial half-section of nonzero thickness 1, 2 or 101, 102, 103 such that the outer lateral ends of the helical coils 1, 2 or 101, 102, 103 are arranged in the vicinity of one same sphere 5 or 105 of radius c whose centre O is placed on the axis Oz in the centre of the zone of interest ZI and which encompasses the magnet device assembly.

In this manner a true circumspherical magnet device is obtained with coils of predetermined thickness. The changeover from the preceding ideal solutions determined at a first step to real configurations is then very simple at this stage. All that is required is to replace the thin solenoids by coils with rectangular axial semi-section whose thickness is now finite.

We are faced here with a conventional problem of optimization in which geometrical parameters are fixed (inner coil radius $a_{11}$, maximum outer radius $a_{32}$, maximum total length $2b_1$) and the overall current densities for the coils with or without gradation. The geometrical data obtained for the ideal configurations with the same number of coils provide the necessary starting values, in particular the thicknesses $e_i$ of the true coils with current density $j_i$ where $j_i e_i \approx \kappa_i$.

The dotted line in FIGS. 1 and 2 outlines the smallest sphere 5 respectively 105 and the square of the smallest cylinder 6 respectively 106 encompassing the magnet.

According to the invention, initially an assembly of thin solenoids is used so that it is possible simultaneously and automatically to solve the problem of homogeneity and stray field reduction, the imposed condition then being simple and lying in the need that the end circles of the thin solenoids should be substantially positioned on the same sphere. A thin solenoid being a theoretical ideal, whereas in a true coil a certain thickness is evidently needed to pass the current, even in a superconductor of the invention, the solution obtained with thin solenoids is developed by making them thicker via an optimization process as indicated above. Under these conditions, none of the end circles of the thick solenoids (that of the inner radius and that of the outer radius) can continue to be strictly positioned on the same sphere, but these end circles remain in the vicinity of a sphere corresponding to the ideal case with thin solenoids, the vicinity of the end circles relative to the sphere being closer the thinner the solenoids. On the other hand, despite this less close vicinity it is possible, for the assembly of actual thick solenoids, to maintain the same properties of homogeneity and stray field as for the assembly of thin solenoids, by suitably choosing the inner and outer radii (which surround the radius of the corresponding thin solenoid) and the lengths (each also being close to that of the corresponding thin solenoid) the whole globally remaining approximately inscribed within a sphere.

To summarize, the compact superconducting magnet device to generate a homogeneous, intense magnetic field component Bz along an axis Oz in a zone of interest ZI, successively comprises—starting from the axis Oz—at least two coaxial superconducting helical coils 1, 2 formed around circular cylinder sections 10, 20 of axis Oz delimited by end circles 10A, 10B, 20A, 20B. The lateral ends of the helical coils 1, 2 (or 101 to 103) are arranged, to within the thickness of the coils, in the vicinity of one same sphere 5 (or 105) of radius c whose centre O is placed on the axis Oz in the centre of the zone of interest ZI and which encompasses the magnet device assembly. The azimuthal current densities $j_1$, $j_2$ of the helical coils 1, 2 (or the azimuthal current densities $j_1$, $j_2$, $j_3$ of the helical coils 101 to 103) are alternately of opposite sign. The lengths $2b_1$, $2b_2$ (and optionally $2b_3$) of the helical coils 1, 2 (or 101 to 103) are of decreasing length. Rings 4; 104 in magnetic material centred on the axis Oz and having symmetry relative to a median plane xOy passing through the centre O of the sphere 5; 105 and perpendicular to the axis Oz are inserted between the first and second coils 1, 2; 101, 102 inside the sphere 5; 105 and are magnetized to saturation with opposite magnetization to that of the field set up at the centre O of the sphere 5; 105.

According to one particular embodiment, the outer radius $a_{22}$ (or $a_{32}$) of the outermost superconducting helical coil 2 (or 103) is substantially equal to the half-length $b_1$ of the innermost superconducting helical coil 1 (or 101), and the outer radius $a_{12}$ of the innermost superconducting helical coil 1 (or 101) is substantially equal to the half-length $b_2$ (or $b_3$) of the outermost superconducting helical coil 2 (or 103).

The invention claimed is:

1. A compact superconducting magnet device to generate a homogeneous magnetic field component Bz along an axis Oz in a zone of interest ZI for nuclear magnetic resonance or magnetic resonance imaging applications, successively comprising, starting from the axis Oz and in a direction perpendicular to this axis Oz, a first superconducting helical coil around a first circular cylinder section of axis Oz delimited by first end circles, said first superconducting helical coil having a first outer radius a first inner radius, and a first length, with a first azimuthal current density $j_1$, at least one second superconducting helical coil formed around a second circular cylinder section of axis Oz delimited by second end circles and surrounding said first circular cylinder section, the said second coil having a second outer radius, a second inner radius and a second length, with a second azimuthal current density $j_2$, wherein the lateral ends of the first and second helical coils are arranged, to within the thickness of the coils, in the vicinity of one same sphere of radius c whose centre O is placed on the axis Oz in the centre of said zone of interest ZI and which encompasses the magnet device assembly, in that the first and second azimuthal current densities $j_1$, $j_2$ are of opposite sign, and wherein rings in magnetic material centred on the axis Oz and having symmetry relative to a median plane xOy passing through the centre O of the sphere perpendicular to the axis Oz are inserted between the first and second coils inside said sphere and are magnetized to saturation with magnetization in opposite direction to that of the field set up in the centre O of said sphere.

2. The device according to claim 1, further comprising at least one third superconducting helical coil (103) formed around a third circular cylinder section of axis Oz delimited by third end circles and surrounding said second cylinder section, said third coil having a third outer radius, a third inner radius and a third length, with a third azimuthal current density $j_3$, wherein the first, second and third azimuthal current densities $j_1$, $j_2$, $j_3$ are alternately of opposite sign, and wherein the first, second and third lengths of the first, second and third coils are of decreasing lengths.

3. The device according to claim 1, wherein the rings in magnetic material centred on the axis Oz comprise two pairs of rings of different cross-sections arranged symmetrically relative to the said median plane xOy.

4. The device according to claim 1, wherein the rings in magnetic material are in magnet material having saturation magnetization at least as high as that of iron.

5. The device according to claim 4, wherein the rings in magnetic material are in iron or an iron alloy.

6. The device according to claim 5, wherein the rings in magnetic material are in an alloy of iron and cobalt.

7. The device according to claim 1, wherein the rings in magnetic material are in ferrite of composition $XFe_2O_4$, where X is formed of one or more of the elements comprising Mn, Zn, Ni, Co, Cu, Mg, Fe.

8. A method for producing a superconducting magnet device to generate a homogeneous magnetic field component Bz along an axis Oz in a zone of interest for nuclear magnetic resonance or magnetic resonance imaging applications, comprising the following steps:

a. determining a first circular cylinder section of axis Oz delimited by first end circles and having a first predefined radius and a first predefined length respectively corresponding to the minimum radius and the maximum length of said zone of interest ZI, b. determining a last circular cylinder section of axis Oz delimited by last end circles, surrounding said first circular cylinder section and having a last predefined radius and a last predefined length so that said last circular cylinder section is contained within a sphere of radius c and centre O containing said zone of interest ZI, c. considering a first surface current sheet formed on the first circular cylinder section of axis Oz, and a last thin surface current sheet formed on the last circular cylinder section of axis Oz, the successive coaxial surface current sheets each having a surface azimuthal current density $\kappa_i$ such that two adjacent coaxial surface current sheets have surface azimuthal current densities of opposite sign, and determining the geometry of intermediate rings in magnetic material centred on the axis Oz and having symmetry relative to a median plane xOy passing through the centre O of the sphere and perpendicular to the axis Oz and inserted between the first and second coils inside said sphere, the said rings being magnetized with magnetization in opposite direction to that of the field set up at the centre O of said sphere so as to optimize the homogeneity of the magnetic field in said zone of interest ZI, and d. replacing the successive coaxial surface current sheets by axisymmetric superconducting coils with rectangular axial half-section of nonzero thickness such that the lateral ends of the helical coils are arranged, to within the thickness of the coils, in the vicinity of one same sphere of radius c whose centre O is placed on the axis Oz at the centre of said zone of interest ZI and which encompasses the magnet device assembly.

9. The method according to claim 8, wherein an intermediate circular cylinder section is also determined of axis Oz delimited by intermediate end circles, inserted between said first circular cylinder section and said last circular cylinder section, said intermediate circular cylinder section having an intermediate predefined radius of between the minimum radius of said zone of interest ZI and the last predefined radius and an intermediate predefined length of between said last predefined length and said maximum length, so that the first end circles, the intermediate end circles and the last end circles are positioned substantially on said sphere of centre O and radius c, an intermediate surface current sheet is determined and an intermediate axisymmetric superconducting helical coil is determined with rectangular axial half-section of nonzero thickness, the rings in magnetic material being arranged in the free space contained between the first superconducting helical coil corresponding to the first circular cylinder section and the intermediate axisymmetric superconducting helical coil corresponding to the intermediate circular cylinder section.

10. The method according to claim 8, wherein the rings in magnetic material are chosen from magnetic material having saturation magnetization at least as high as that of iron.

11. The method according to claim 10, wherein the rings in magnetic material are chosen from iron or an iron alloy.

12. The method according to claim 11, wherein the rings in magnetic material are chosen to be an iron and cobalt alloy.

13. The method according to claim 8, wherein the rings in magnetic material are chosen from a ferrite of composition $XFe_2O_4$, where X is formed by one or more of the elements comprising Mn, Zn, Ni, Co, Cu, Mg, Fe.

* * * * *